(12) United States Patent
Viitanen et al.

(10) Patent No.: US 11,823,320 B2
(45) Date of Patent: Nov. 21, 2023

(54) SCATTERED GEOMETRY COMPRESSION FOR RAY TRACING ACCELERATION STRUCTURES

(71) Applicant: NVIDIA Corporation, Santa Clara, CA (US)

(72) Inventors: Timo Tapani Viitanen, Helsinki (FI); Tero Tapani Karras, Helsinki (FI); Samuli Laine, Vantaa (FI)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/688,674

(22) Filed: Mar. 7, 2022

(65) Prior Publication Data

US 2022/0198741 A1    Jun. 23, 2022

Related U.S. Application Data

(63) Continuation of application No. 16/880,821, filed on May 21, 2020, now Pat. No. 11,270,495.

(51) Int. Cl.
*G06T 15/00*    (2011.01)
*G06T 15/06*    (2011.01)
(Continued)

(52) U.S. Cl.
CPC .............. *G06T 15/06* (2013.01); *G06F 3/064* (2013.01); *G06F 3/0608* (2013.01);
(Continued)

(58) Field of Classification Search
CPC ......... G06T 19/00; G06T 17/20; G06T 17/00; G06T 15/10; G06T 15/00
(Continued)

(56) References Cited

U.S. PATENT DOCUMENTS

| 5,237,460 A | 8/1993 | Miller et al. |
| 5,884,269 A * | 3/1999 | Cellier ................... H03M 7/40 |
| | | 714/759 |

(Continued)

OTHER PUBLICATIONS

Kenzel, M. et al., "On-the-fly Vertex Reuse for Massively-Parallel Software Geometry Processing", Proceedings of the ACM on Computer Graphics and Interactive Techniques, vol. 1, No. 2, pp. 1-17 (Aug. 2018).

(Continued)

*Primary Examiner* — Gordon G Liu
(74) *Attorney, Agent, or Firm* — Taylor English Duma L.L.P.

(57) ABSTRACT

In examples, a list of elements may be divided into spans and each span may be allocated a respective memory range for output based on a worst-case compression ratio of a compression algorithm that will be used to compress the span. Worker threads may output compressed versions of the spans to the memory ranges. To ensure placement constraints of a data structure will be satisfied, boundaries of the spans may be adjusted prior to compression. The size allocated to a span (e.g., each span) may be increased (or decreasing) to avoid padding blocks while allowing for the span's compressed data to use a block allocated to an adjacent span. Further aspects of the disclosure provide for compaction of the portions of compressed data in memory in order to free up space which may have been allocated to account for the memory gaps which may result from variable compression ratios.

20 Claims, 9 Drawing Sheets

(51) Int. Cl.
   *G06T 1/20* (2006.01)
   *G06T 1/60* (2006.01)
   *G06T 9/00* (2006.01)
   *H03M 7/30* (2006.01)
   *G06F 9/50* (2006.01)
   *G06F 3/06* (2006.01)
   *G06F 9/52* (2006.01)

(52) U.S. Cl.
   CPC .......... *G06F 3/0673* (2013.01); *G06F 9/5016* (2013.01); *G06F 9/52* (2013.01); *G06T 1/20* (2013.01); *G06T 1/60* (2013.01); *G06T 9/001* (2013.01); *H03M 7/30* (2013.01)

(58) Field of Classification Search
   USPC ........................................................ 345/419
   See application file for complete search history.

(56) References Cited

U.S. PATENT DOCUMENTS

| | | | |
|---|---|---|---|
| 2003/0112419 A1* | 6/2003 | Silverbrook | G06F 21/79 355/41 |
| 2016/0071234 A1 | 3/2016 | Lehtinen et al. | |
| 2016/0179574 A1* | 6/2016 | Merrill, III | G06F 9/5066 718/106 |
| 2020/0320776 A1 | 10/2020 | Doyle et al. | |

OTHER PUBLICATIONS

Maglo, A. et al., "3D Mesh Compression; Survey, Comparisons, and Emerging Trends", ACM Computing Surveys (CSUR), vol. 47, No. 3, pp. 1-41 (Feb. 2015).

\* cited by examiner

FIGURE 4A

| ADJUSTMENT (1ST SPAN END) | BLOCK 0 | | | BLOCK 1 | | | BLOCK 2 | | | BLOCK 3 | | | BLOCK 4 | | | BLOCK 5 | | |
|---|---|---|---|---|---|---|---|---|---|---|---|---|---|---|---|---|---|---|
| 0 | 0 | 1 | 2 | 3 | | | | | | | | | | | | | | |
| 1 | 0 | 1 | 2 | 3 | 4 | | 4 | 5 | 6 | | | | | | | | | |
| 2 | 0 | 1 | 2 | 3 | 4 | 5 | 5 | 6 | 7 | 7 | | | | | | | | |
| 3 | 0 | 1 | 2 | 3 | 4 | 5 | 6 | 7 | | | | | | | | | | |
| 4 | 0 | 1 | 2 | 3 | 4 | 5 | 6 | 7 | 8 | 7 | | | 8 | 9 | 10 | | | |
| 5 | 0 | 1 | 2 | 3 | 4 | 5 | 6 | 7 | 8 | | | | 8 | 9 | 10 | | | |
| 6 | 0 | 1 | 2 | 3 | 4 | 5 | 6 | 7 | 8 | | | 9 | 8 | 9 | 10 | | | |
| 7 | 0 | 1 | 2 | 3 | 4 | 5 | 6 | 7 | 8 | 9 | 10 | | 9 | 10 | 11 | | | 11 |
| 8 | 0 | 1 | 2 | 3 | 4 | 5 | 6 | 7 | 8 | 9 | 10 | 11 | 10 | 11 | | | | |

ELEMENT INDEX: 0 1 2 3 4 5 6 7 8 9 10 11 12 13 14 16 17 18

| ADJUSTMENT (1ST, 2ND SPAN ENDS) | BLOCK 0 | | | BLOCK 1 | | | BLOCK 2 | | | BLOCK 3 | | | BLOCK 4 | | | BLOCK 5 | | |
|---|---|---|---|---|---|---|---|---|---|---|---|---|---|---|---|---|---|---|
| 0 | 0 | 1 | 2 | 3 | | | 4 | 5 | 6 | 7 | | | 8 | 9 | 10 | 11 | | |
| 1 | 0 | 1 | 2 | 3 | 4 | | 5 | 6 | 7 | 8 | | | 9 | 10 | 11 | | | |
| 2 | 0 | 1 | 2 | 3 | 4 | 5 | 6 | 7 | 8 | 9 | | | 10 | 11 | | | | |
| 3 | 0 | 1 | 2 | 3 | 4 | 5 | 6 | 7 | 8 | 9 | | | 10 | | | 11 | | |
| 4 | 0 | 1 | 2 | 3 | 4 | 5 | 6 | 7 | 8 | 9 | 10 | | 11 | | | | | |
| 5 | 0 | 1 | 2 | 3 | 4 | 5 | 6 | 7 | 8 | 9 | 10 | 11 | | | | | | |
| 6 | 0 | 1 | 2 | 3 | 4 | 5 | 6 | 7 | 8 | 9 | 10 | | | | | 11 | | |
| 7 | 0 | 1 | 2 | 3 | 4 | 5 | 6 | 7 | 8 | 9 | 10 | | 11 | | | | | |
| 8 | 0 | 1 | 2 | 3 | 4 | 5 | 6 | 7 | 8 | 9 | 10 | 11 | | | | | | |

ELEMENT INDEX

FIGURE 4B

SCATTERED GEOMETRY COMPRESSION FOR RAY TRACING ACCELERATION STRUCTURES

RELATED APPLICATIONS

This application is a continuation of U.S. patent application Ser. No. 16/880,821, entitled "SCATTERED GEOMETRY COMPRESSION FOR RAY TRACING ACCELERATION STRUCTURES" filed May 21, 2020 and incorporated herein by reference in its entirety.

BACKGROUND

Ray tracing is a technique for rendering images by tracing paths of light in a three-dimensional (3D) scene and simulating the effects of the light's interactions with objects in the scene. To do so, a conventional system may use an acceleration structure—such as a Bounding Volume Hierarchy (BVH)—to improve the speed of testing for intersections between the objects and rays of the paths of light. For example, a BVH may include a tree structure built for a set of geometric elements in a state of the scene, with the geometric elements being wrapped in bounding volumes that form leaf nodes of the tree. These nodes may then be grouped into sets and enclosed within larger bounding volumes. The BVH may be used to quickly eliminate potential intersection candidates within a scene by omitting geometric elements located in bounding volumes which are not intersected by a particular ray. When the scene changes, a new BVH may need to be built or the current BVH may be adjusted to reflect those changes.

The performance of ray tracing may in some cases be further enhanced by storing the geometric elements of a BVH in a compressed format in memory. In order to compress geometric elements, a conventional compression algorithm may be parallelized by forming equally-sized groups of the geometric elements, with each group being compressed by a respective worker thread. In a first pass, the worker threads may compress geometric elements to determine how much memory must be allocated to store the compressed list and where to store compressed outputs from the groups in memory. In a second pass, the geometric elements may be compressed again to store the compressed outputs contiguously at appropriate locations in the memory. However, this approach may introduce significant overhead to a rendering process. For example, in a scene with dynamic objects, compressed BVHs for those objects may need to be built or refit and compressed for every frame.

SUMMARY

Embodiments of the disclosure relate to scattered geometry compression for ray tracing acceleration structures. In particular, the disclosure provides, in part, approaches to improve parallelized compression performance, which may be used to compress elements of data structures. The elements may be compressed and stored in memory in a single pass (e.g., by independent worker threads), while respecting constraints on where portions of compressed data are located in the memory, thereby significantly reducing compression time.

In some respects, a list of elements may be divided into spans and each span may be allocated a respective memory range for output (e.g., implicitly by computing and reserving a total memory size sufficient to accommodate all spans) based at least on an assumed compression ratio (e.g., a worst-case compression ratio) of a compression algorithm that will be used to compress the span. Each worker thread (or group of worker threads) may then output a compressed version of a corresponding span to one or more of the memory ranges. In further respects, to ensure that placement constraints of a data structure will be satisfied, boundaries of the spans may be adjusted prior to compression. By assigning related elements to the same worker thread (e.g., by adjusting span lengths), the worker thread may ensure compliance with the placement constraints within a span. In further respects, the size allocated to a span (e.g., each span) may be adjusted (e.g., increased or decreased) to avoid padding blocks while allowing for the span's compressed data to use a block allocated to an adjacent span. Further aspects of the disclosure provide for compaction of the portions of compressed data in memory in order to free up space which may have been allocated to account for the memory gaps which may result from variable compression ratios.

BRIEF DESCRIPTION OF THE DRAWINGS

The present systems and methods for scattered geometry compression for ray tracing acceleration structures is described in detail below with reference to the attached drawing figures, wherein:

FIG. 4A is a diagram illustrating an example of a memory allocation scheme applied to spans for different adjustments to span ends made to a first span of the spans, in accordance with some embodiments of the present disclosure to embodiments of the present disclosure;

FIG. 4B is a diagram illustrating an example of the memory allocation scheme of FIG. 4A applied to spans for different adjustments to span ends made to a first span and a second span of the spans, in accordance with some embodiments of the present disclosure to embodiments of the present disclosure;

DETAILED DESCRIPTION

Figure 1:
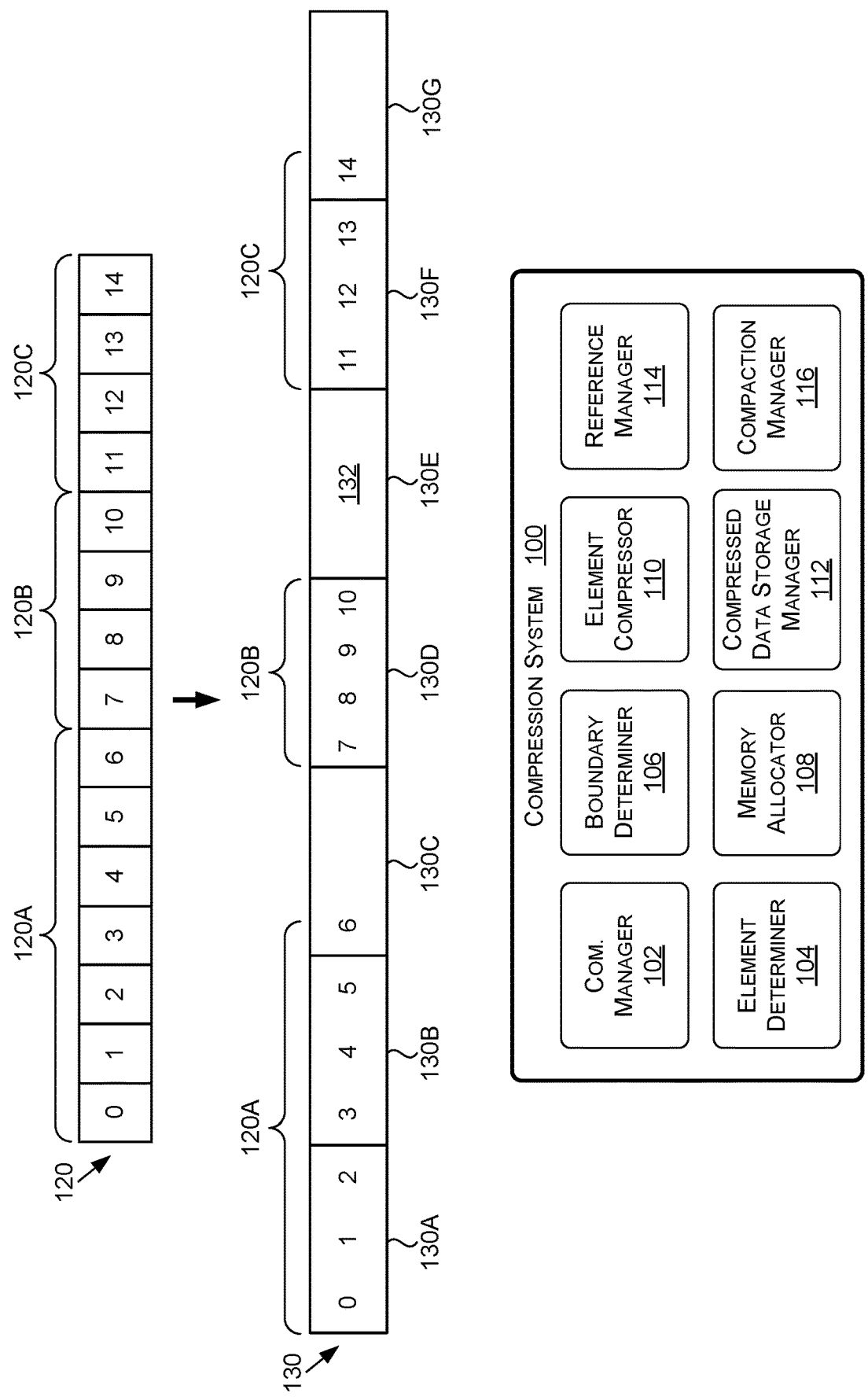
FIG. 1 is a diagram illustrating an example of a compression system, which may be used to compress and store elements in memory, in accordance with some embodiments of the present disclosure.

The present disclosure relates to scattered geometry compression for ray tracing acceleration structures. In particular, the disclosure provides, in part, approaches to improve parallelized compression performance, which may be used to compress a list geometric elements (e.g., geometry instances, primitives such as triangles, etc.) for a BVH or more generally other types of elements (e.g., characters, numbers, bits, etc.) for other types of data structures. In various embodiments, the elements may be compressed and stored in memory in a single pass (e.g., by independent worker threads of a GPU), while adhering to constraints on where portions of compressed data are located in the memory, thereby significantly reducing compression time.

In accordance with aspects of the disclosure, a list of elements may be divided into spans, where each span is to be operated on by a respective worker thread. Alternatively, each span may be operated on by a group of multiple worker threads (e.g., a warp). Disclosed embodiments may be compatible with Single Instruction, Multiple Data (SIMD), Single Instruction, Multiple Threads (SIMT) or Multiple Instruction, Multiple Data (MIMD) execution, by way of example. Each span may be allocated a respective memory range for output based at least on an assumed compression ratio (e.g., a worst-case compression ratio) of a compression algorithm that will be used to compress the span. Each worker thread may then output a compressed version of a corresponding span to one or more of the memory ranges. By allocating memory based on the assumed compression ratio, it can be ensured that each span has enough memory for its compressed data without overlapping data from another range. As such, the size of the compressed data need not be known in advance of memory allocation.

In further respects, the compressed data for different spans may have different compression ratios due to the variable nature of compression algorithms. This may result in the compressed list of elements violating a data structure's constraints on where portions of compressed data are allowed to be stored in memory (also referred to as placement constraints). To ensure these placement constraints will be satisfied, start and/or end points of one or more of the spans may be adjusted prior to compression. For example, a data format for a BVH may define that each of the primitives that are under a same node of the BVH are to be stored contiguously in memory. Without adjusting the spans, a node's primitives may be assigned to multiple worker threads and spans. This may result in a memory gap between span outputs—due to the variable nature of compression—that violates the placement constraints of the BVH. By assigning the related primitives to the same worker thread (e.g., by adjusting span lengths), the worker thread may ensure the related primitives comply with the placement constraints.

Further aspects of the disclosure provide approaches for determining a number of memory blocks to allocate to storage for the portions of compressed data from the spans while avoiding overlapping data between spans. In some embodiments, for each span, a worst-case block count needed to compress the span may be computed, and the number of memory blocks that are allocated may be a sum of the worst-case block counts with one extra padding block being added per span. However, given the value ("spanElements") of the number of elements of each span to compress prior to boundary adjustment (if performed), and a separate value ("BlocksElements") for the worst-case number of elements that may be compressed into a block for a compression algorithm, then, if spanElements divided by (mod) BlocksElements=1, the padding block may be avoided for the spans. Embodiments may leverage this property by increasing (or decreasing) the size allocated to a span (e.g., each span) to a nearest value such that spanElements mod BlocksElements=1. This may provide space for each span's compressed data to use a block allocated to an adjacent span for output. Similarly, if spanElements mod BlocksElements=0, the padding block may be avoided for the spans. Embodiments may leverage this property by increasing (or decreasing) the size allocated to a span (e.g., each span) to a nearest value such that spanElements mod BlocksElements=0.

Aspects of the disclosure also provide for compaction of the portions of compressed data in memory in order to free up space which may have been allocated to account for the memory gaps which may result from variable compression ratios. At compression time, a bitmask may be allocated that marks each output block, the number of set bits may be computed from the bitmask, and a prefix sum may be computed over the set bit counts. At compaction time, when copying a block to a new buffer, the prefix sum and the bitmask values may be used to find a new position for the block. In one or more embodiments, element references of the data structure (e.g., from BVH nodes to primitives in memory) may also be patched based on the prefix sum and the bitmask values.

With reference to FIG. 1, FIG. 1 is a diagram illustrating an example of a compression system 100, which may be used to compress and store elements 120 in a memory 130, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. By way of example, the compression system 100 may be implemented on one or more instances of the computing device 800 of FIG. 8.

The compression system 100 may include, among other things, a communications manager 102, an element determiner 104, a boundary determiner 106, a memory allocator 108, an element compressor 110, a compressed data storage manager 112, a reference manager 114, and a compaction manager 116.

The communications manager 102 of the compression system 100 may be configured to manage communications provided by the compression system 100, provided to the compression system 100, and/or provided within the compression system 100. The element determiner 104 may be configured to determine elements to compress, such as the elements 120. The boundary determiner 106 may be configured to determine boundaries between the elements to compress—which may include defining spans or groups of the elements—such as spans 120A, 120B, and 120C. The memory allocator 108 may be configured to allocate memory ranges in memory for the compressed spans or groups of elements delineated by the boundary determiner 106. The element compressor 110 may be configured to apply a compression algorithm to the groups of elements to generate the compressed spans or groups of elements. The compressed data storage manager 112 may be configured to store the compressed spans or groups of elements in the allocated memory ranges, such as in blocks 130A, 130B, 130C, 130D, 130E, 130F, and 130G of the memory 130. The reference manager 114 may be configured to map a data structure—such as one or more referencing elements of the data structure—to the compressed spans or groups of elements and/or portions thereof. The compaction manager 116 may be configured to compact one or more of the compressed spans or groups of elements in the memory to recover storage from one or more gaps which may form in the memory—such as gap 132 in the memory 130. In embodiments that include compaction, the reference manager 114 may be configured to map a data structure to the compressed data after compaction and/or update mappings defined prior to compaction.

As described herein, the communications manager 102 of the compression system 100 may be configured to manage communications provided by the compression system 100, provided to the compression system 100, and/or provided within the compression system 100. Any combination of such communications may be facilitated, for example, by any combination of the communication interface 810, the I/O ports 812, the I/O components 814, or the interconnect system 802 of the computing device(s) 800 of FIG. 8.

Communications may be provided to and/or from the compression system 100 using one or more Application Programming Interfaces (APIs). An API may refer to a computing interface to a software component or a system that defines how other components or systems use the software component or system. The API may define the calls or requests that can be made, how to make them, the data formats that should be used, the conventions to follow, etc. The software component or system may be defined by the API in terms of its operations, inputs, outputs, and underlying types, defining functionalities that are independent of their respective implementations, which allows definitions and implementations to vary without compromising the interface.

Figure 8:
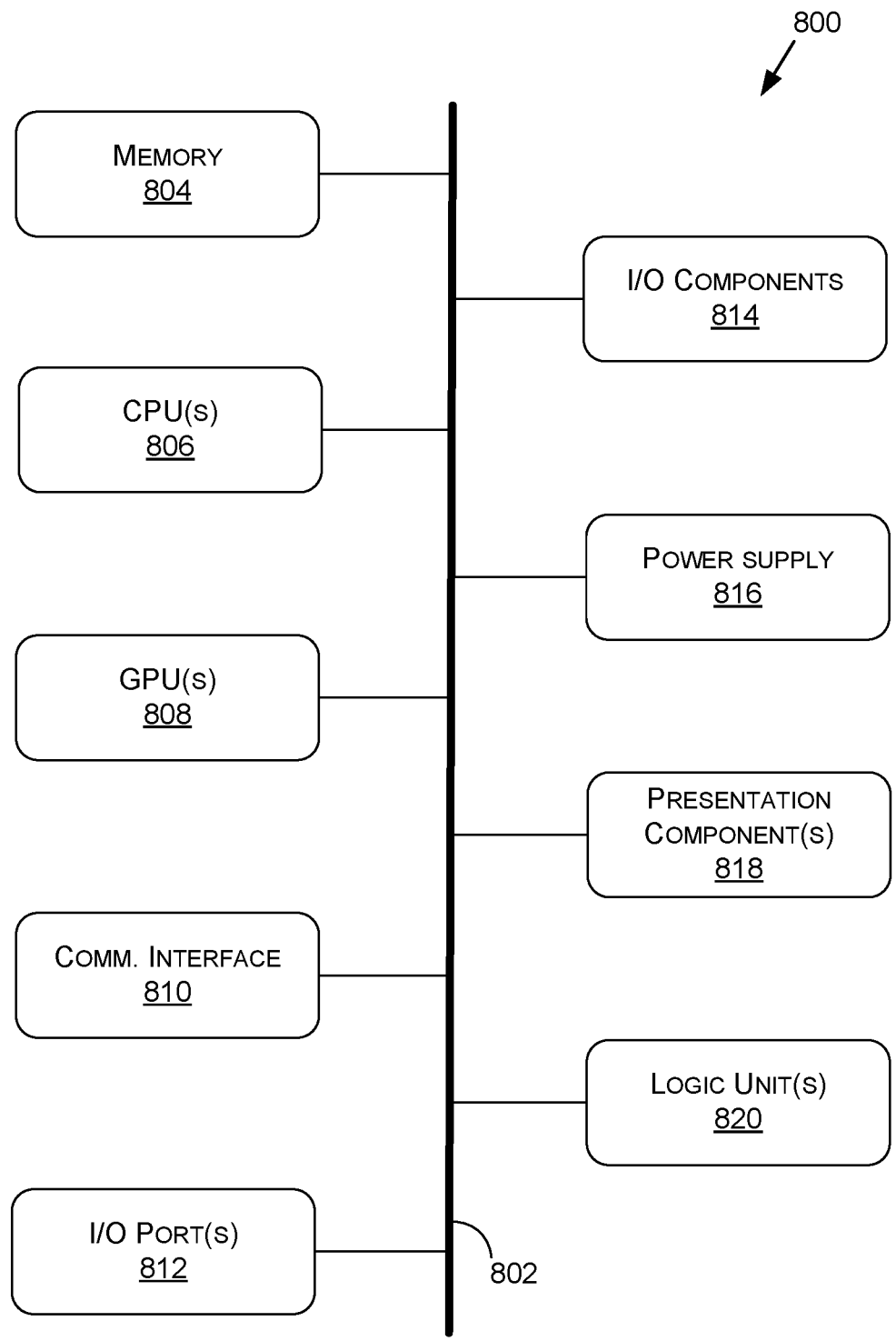
FIG. 8 is a block diagram of an example computing device suitable for use in implementing some embodiments of the present disclosure.

The communications manager 102 may implement an API of a parallel computing platform, which may use one or more parallel processing units (PPUs), such as one or more GPUs 808, CPUs 806, or logic units 820 of the computing device(s) 800 of FIG. 8. The parallel computing platform may be configured to distribute processing performed by any combination of one or more components of the compression system 100 across a plurality of worker threads of the one or more PPUs that perform the processing in parallel. For example, one or more of the boundary determiner 106, the memory allocator 108, the element compressor 110, and the compressed data storage manager 112, the reference manager 114, or the compaction manager 116 may operate at least partially in parallel.

In some implementations, the elements 120 may be read and analyzed by the boundary determiner 106 and one or more portions of the memory 130 may be allocated by the memory allocator 108 (e.g., by a CPU in response to a first API call). Using a single compute kernel (executed in parallel by worker threads) and a single read of the elements 120, the elements 120 may be compressed by element compressor 110, and the compressed data may be stored by the compressed data storage manager 112 in the blocks 130A, 130B, 130C, 130D, 130E, 130F, or 130G (e.g., by a GPU in response to a second API call). Where the reference manager 114 and/or the compaction manager 116 are employed, they may be executed by another compute kernel.

By way of example, in various embodiments an API(s) may include calls for building, compressing, updating, compacting and/or rebuilding a data structure that stores the elements 120, and/or calls for compressing and/or compacting the elements 120. In some examples, the compression system 100 may be at least partially integrated into a rendering system 200 of FIG. 2. In such examples, the API(s) may also be for interfacing with the rendering system 200. In other examples, the compression system 100 may be separate from the rendering system 200 and the rendering system 200 or different software may interface with the compression system 100 (e.g., via one or more APIs) for use of any combination of the components thereof.

Figure 2:
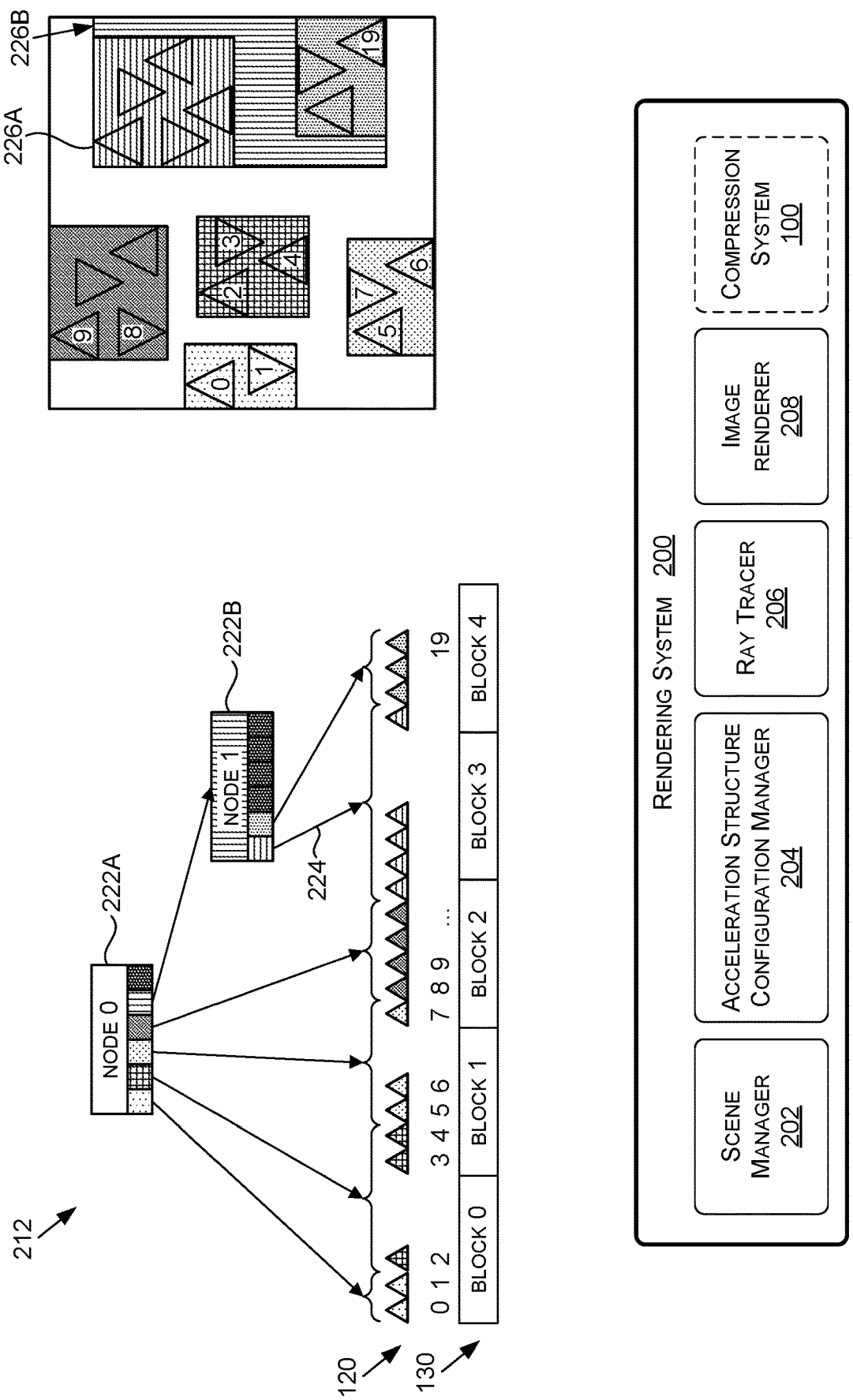
FIG. 2 is a diagram illustrating an example of a rendering system, which may implement the compression system of FIG. 1, in accordance with some embodiments of the present disclosure.

Referring now to FIG. 2, FIG. 2 is a diagram illustrating an example of a rendering system 200, which may implement the compression system 100 of FIG. 1, in accordance with some embodiments of the present disclosure. The rendering system 200 is provided as an example of a system or software that may include or interact with one or more portions of the compression system 100. Other types of systems or software may be used which may not implement image rendering and/or ray-tracing. The rendering system 200 may include, among other things, a scene manager 202, an acceleration structure configuration manager 204, a ray tracer 206, and an image renderer 208.

The scene manager 202 may be configured to set up, control, and manage a 3D scene, which in the example of FIG. 2 may include the elements 120 of the 3D scene. In the example shown in FIG. 2, the elements 120 comprise geometric elements and more particularly triangles. Other suitable examples of geometric elements include geometry instances, primitives, vertices, or bounding boxes of a 3D mesh.

The scene manager 202 may also be configured to set up, control, and manage one or more acceleration structures used to render the 3D scene, and resources used by the acceleration structure(s) to render the 3D scene. To do so, the scene manager 202 may manage the relationships and references between scene elements and the resources (e.g., the memory 130) using one or more acceleration structures, such as an acceleration structure 212 of FIG. 2. This may include tracking changes to scene elements, such the motion and locations of scene objects, and building or updating acceleration structures—such as the acceleration structure 212—to reflect corresponding states of the 3D scene. For example, the scene manager 202 may use the acceleration structure configuration manager 204 to configure the acceleration structure 212 to capture a state of the 3D scene using the compression system 100. As a result, the elements 120 of the acceleration structure 212 may be compressed and stored in the memory 130 in a format that is compatible with the acceleration structure 212.

The ray tracer 206 may be configured to trace one or more rays in the 3D scene, such as to test for intersections of the ray(s) with geometry in the 3D scene (e.g., in response to ray tracing queries and/or ray tracing function calls). To do so, the ray tracer 206 may use the one or more acceleration structures that capture the state of the 3D scene, such as the acceleration structure 212.

The image renderer 208 may be configured to render one or more portions of the 3D scene using ray tracing techniques implemented by the ray tracer 206, such as to determine colors of pixel values (e.g., for one or more images) based at least on the configuration of the 3D scene and orchestration of rendering by the scene manager 202. For example, to determine a color of one or more pixels, the image renderer 208 may use the ray tracer 206 to cast a ray(s) and determine when the ray(s) intersects with geometry in the 3D scene using the acceleration structure 212.

Returning to FIG. 1, as described herein, the element determiner 104 may be configured to determine elements to compress, such as the elements 120. In some examples, the element determiner 104 may determine the elements 120 based at least on an API call to the compression system 100. The elements 120 may, for example, by identified by the element determiner 104 in association with a data structure that stores or is to store the elements 120. For example, the API call may provide the elements 120 and/or the data structure used to identify the elements 120. In embodiments where the rendering system 200 uses the compression system 100, the elements 120 may be provided by the acceleration structure configuration manager 204 and the data structure may be the acceleration structure 212.

The elements 120 may comprise any of a variety of possible data elements and/or data objects, such as geometric elements, characters, numbers, words, bits, etc. As described herein, examples of geometric elements include geometry instances, primitives such as triangles, vertices, or bounding boxes of a 3D mesh. The data structure may comprise any of a variety of possible types of data structures, such as documents, arrays, records, trees, graphs, lists, etc. In various embodiments, the elements 120 may be (or correspond to) nodes, leaves, children, parents, siblings, and/or other elements of a tree-based data structure. In the example of the acceleration structure 212, the elements 120 form the leaves of the tree-based data structure (one leaf may comprise multiple elements).

The boundary determiner 106 may be configured to determine boundaries between the elements 120 to compress—which may include defining spans or groups of the elements—such as spans 120A, 120B, and 120C. Each span defined by the boundary determiner 106 may correspond to a respective job, worker thread, or a group of worker threads, which may in parallel compress the elements 120 within a corresponding span using the element compressor 110 and store the compressed data at an allocated memory range in the memory 130 using the compressed data storage manager 112.

In some embodiments, the boundary determiner 106 defines the spans or groups based at least on constraints on where portions of compressed data are to be stored in the memory 130 (also referred to as placement constraints) and/or relationships between the elements 120. Defining the spans or groups that are compressed based at least on the placement constraints and/or relationships may allow for parallel compression and storage without first needing an additional compression pass to determine how much of the memory 130 must be allocated to store the compressed data and where to store particular portions of the compressed outputs in the memory 130 so that they comply with the placement constraints.

The placement constraints may, for example, be defined by a data structure that is to store the compressed versions of the elements 120. For example, the placement constraints may be configured or defined such that portions of compressed data from different worker threads will be stored at locations that are compatible with the data structure. For example, the placement constraints may ensure that the compressed data is stored according to a format compatible with the data structure.

By way of example, the acceleration structure 212 of FIG. 2 is a tree-based data structure that includes any number of inner nodes, such as an inner node 222A and an inner node 222B. The inner nodes may reference other inner nodes and/or leaves of the tree-based structure. In the example shown, the leaves comprise the elements 120 and the references to the inner nodes are indicated by arrows between particular inner nodes and elements. The acceleration structure 212 may be a BVH, and the references may define bounding volumes of groups of the elements 120 that form leaf nodes of the tree. For example a reference 224 may define a bounding volume 226A for corresponding elements at a base hierarchy level of the BVH and the internal node 222B may group those elements into a larger bounding volume 226B at a higher hierarchy level of the BVH. The BVH may be used by the ray tracer 206 to quickly eliminate potential intersection candidates within a scene by omitting the elements 120 located in bounding volumes which are not intersected by a particular ray.

The acceleration structure 212 may have a format requirement that each inner node's triangle range references are encoded so that that all of the child triangles (e.g., the elements 120) are placed in contiguous blocks in the memory 130. However, if one or more of these triangles are assigned to a different worker node, then the worker threads may need to perform a pass in which the worker threads compress the elements 120 to determine where to store the compressed data so that it conforms to the format requirement. This is because when a variable-rate compression algorithm is used, the sizes of the portions of compressed data from the worker nodes are variable and may be derived by compressing the data.

In the example of the acceleration structure 212, the boundary determiner 106 may be configured to assign all of the child triangles referenced by a same inner node to a same span or group. A worker thread (or group of worker threads) may then independently operate on the group using the element compressor 110 and the compressed data storage manager 112 to compress and store the data such that all of the child triangles are placed in contiguous blocks in the memory 130. As such, the worker thread may ensure that the compressed data for the elements 120 within the span of the worker thread conform to the placement constraints.

The placement constraints of FIG. 2 may be stated more generally as ensuring that a related group of the elements 120 are encoded so that all of the elements 120 of the group are placed in contiguous blocks in the memory 130, which may address the format requirement of the acceleration structure 212 and other data structures having similar format requirements. The placement constraints may be used for other types of data structures than an acceleration structure. For example, there may be a text file containing lines of text—a sequence of characters and line feeds. The placement constraints may be used to compress the text file such that the compressed file allows for decompression of a given line. Here a line of text may be analogous to an internal node of the acceleration structure 212, with characters of the line being analogous to the triangles. When adjusting spans, they may be adjusted based on the line breaks which define the groups of related characters. Examples are described herein primarily using this placement constraint. However, in other examples additional or different placement constraints may be used to define the spans or groups of the elements 120 (e.g., for different types of data structures).

In the example of FIG. 1, elements within each of the spans 120A, 120B, and 120C may be related, such as by being designated as leaves of a same node for the data structure. By assigning the related ones of the elements 120 to the same worker thread (or group of worker threads), the worker thread may ensure the elements 120 of the assigned group are stored in a manner internally consistent with the placement constraints without relying on coordination with other worker threads. In the example of FIG. 1, individual elements are denoted with a respective index number from 0 through 14. As indicated in FIG. 1, the elements within a particular span or group are stored by a worker thread (or a group of worker threads) without a gap to conform to the placement constraint.

Figure 3:
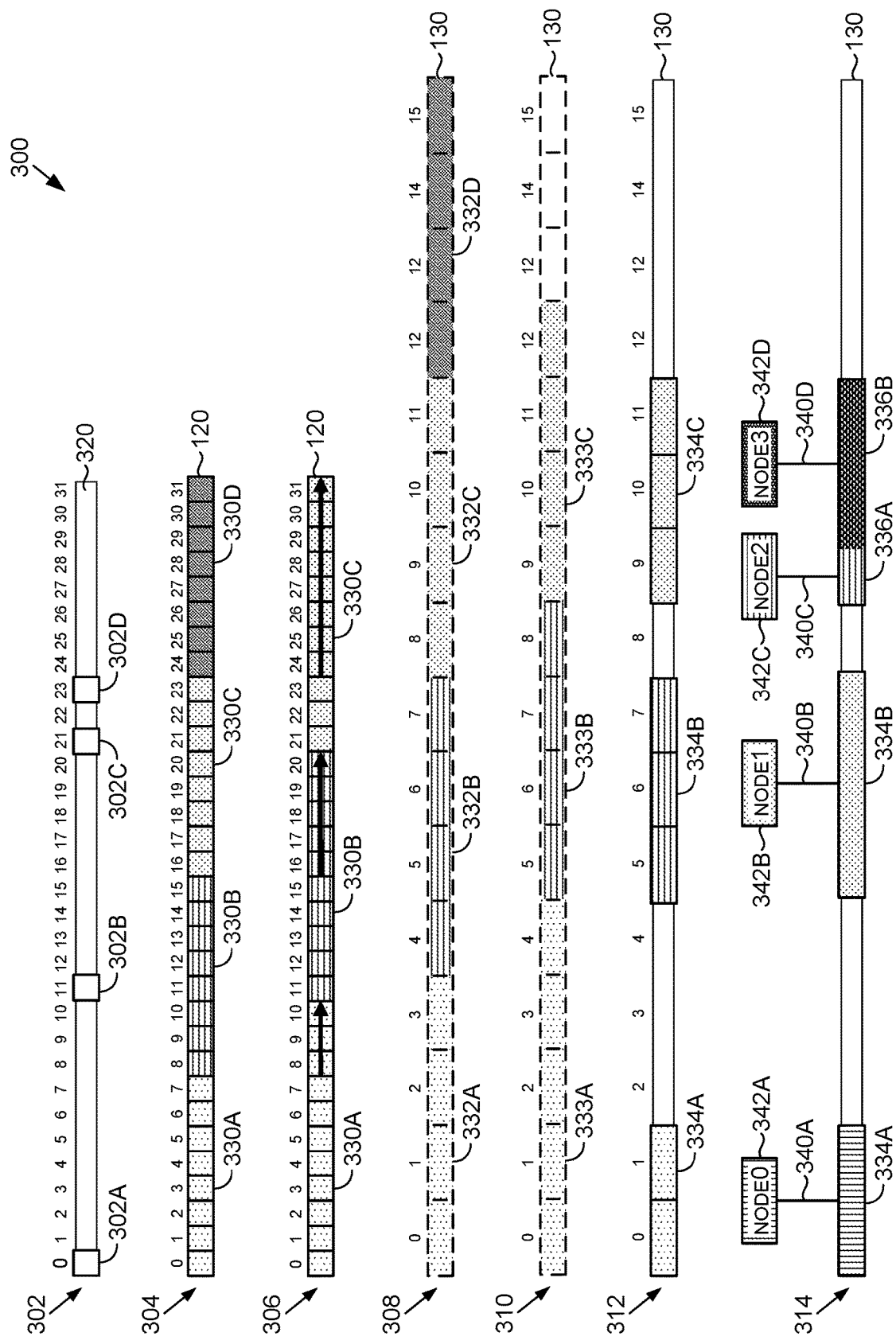
FIG. 3 is a diagram illustrating an example of a process flow for compressing a list of elements, in accordance with some embodiments of the present disclosure.

The boundary determiner 106 may receive the elements 120 as a list or array, such as is indicated in FIG. 1. The list or array may be received form the element determiner 104 in an order or sequence that is prearranged or grouped by related elements. For example, in FIG. 1, related elements may be adjacent one another. Referring now to FIG. 3, FIG. 3 is a diagram illustrating an example of a process flow 300 for compressing a list of elements, in accordance with some embodiments of the present disclosure.

At 302, the element determiner 104 may generate a bitmask 320 that marks valid boundaries of the spans of elements, such as spans 330A, 330B, 330C, and 330D. For example, the bits 302A, 302B, 302C, and 302D of the bitmask 320 may delineate valid start points and end points of the spans 330A, 330B, 330C, and 330D. In some examples, the bitmask may include a '1' for the first element in each valid span although other denotations may be used. The bitmask 320 may be generated based at least on the placement constraints for the elements 120.

At 304, the boundary determiner 106 may compute initial span start and end indices to define initial boundaries of the spans 330A, 330B, 330C, and 330D. This may use a fixed-size allocation scheme in which the boundary determiner 106 divides the list of elements into the spans using a fixed size for each span. For example, the boundary determiner 106 may compute initial boundaries for the spans using a formula that assumes a fixed size for each span. However, in other examples the initial boundaries may not have a fixed size. In other examples a different type of size allocation scheme may be used.

At 306, the boundary determiner 106 may adjust one or more start points or end points of the initial boundaries of the spans 330A, 330B, 330C, and 330D using the bitmask 320. For example, the boundary determiner 106 may adjust or shift a start point or an end point of each span forward to a next valid start point of a span, which may be indicated by a '1' in the bitmask (or to the end of the array). As indicated in FIG. 3, this may eliminate one or more spans, such as the span 330D. In some cases, this process may be optimized by looking at the bitmask 320 one word (e.g., a 32-bit word) at a time. Adjusting span size may have a speed-quality tradeoff: very long spans may reduce parallelism, while short spans may hurt compression ratio. While a bitmask is described as being marked, in other examples a different type of data structure may be used to capture the markings of the valid boundaries (e.g., explicitly or implicitly). For example, a list or B-tree may be used, or the information may be looked up directly from the nodes.

At 308, the memory allocator 108 may allocate one or more portions of the memory 130 to the spans or groups and/or worker threads. For example, the memory allocator 108 may compute a total memory size needed to fit all of the spans based at least on an assumed compression ratio associated with at least one of the spans and/or list of elements 120, a number or count of elements in the list of elements 120 assigned to one or more of the spans, and/or a total number or count of elements in the list of elements 120.

In embodiments, memory ranges are implicitly allocated to the spans and may correspond to (e.g., be computed based on) the boundaries (e.g., initial boundaries) determined by the boundary determiner 106. For example, where the boundary determiner 106 uses a fixed-size allocation scheme, the memory allocator 108 may assume each span is assigned a same number of elements in the list of elements 120. Using a fixed-size allocation scheme, the memory allocator 108 need not account for differences in sizes of each span, but may compute a total size that is used reserve a range or amount of memory sufficient to cover a memory range for each span. In other examples, the memory allocator 108 may not assume each span is assigned a same number of elements, in which case memory ranges may be accounted for individually or by groups of similar sized spans. In FIG. 3, a memory range 332A may correspond to the span 330A, a memory range 332B may correspond to the span 330B, a memory range 332C may correspond to the span 330C, and a memory range 332D may correspond to the span 330D. The example of FIG. 3 may assume a worst-case compression ratio for each span and may add padding for each span. As described herein the memory ranges 332A, 332B, 332C, and 332D may be accounted for implicitly by computing a total size that might be needed to store compressed data from each of the spans 330A, 330B, 330C, and 330D. However, once determined, the compressed data storage manager 112 may store the compressed data in any suitable location within the allocated memory (e.g., by computing corresponding output ranges as described herein).

At 310, the compressed data storage manager 112 may compute one or more locations of output ranges for the spans or groups and/or worker threads in the memory 130. For example, each worker thread (or group of worker threads) may compute one or more locations of an output range for the compressed output based at least on the adjusted boundaries of the span assigned to the worker thread (e.g., as determined from the bitmask 320). In FIG. 3, an output range 333A may correspond to the span 330A, an output range 333B may correspond to the span 330B, and an output range 333C may correspond to the span 330C.

At 312, the element compressor 110 may compress the spans or groups and the compressed data storage manager 112 may store the compressed spans in the memory 130 in the allocated locations using the computed locations of the output ranges. For example, each worker thread (or group of worker threads) may compress the span assigned to the worker thread and store the compressed data in the computed output range of the memory 130. In FIG. 3, a compressed span 334A may correspond to the output range 333A, a compressed span 334B may correspond to the output range 333B, and a compressed span 334C may correspond to the output range 333C. The span 330D may not have a corresponding output range due to span boundary adjustments eliminating the span 330D. While 312 is shown after 310 that is for illustrative purposes, and in reality, 312 may be performed before and/or concurrently with one or more portions of 310 (e.g., an output range location may be computed before, during, and/or after 310).

At 314, the reference manager 114 may map a data structure—such as to one or more referencing elements of the data structure—to the compressed spans. For example, each worker thread (or group of worker threads) may create or update a mapping between a compressed span and a referencing element of the data structure. In FIG. 3, a mapping 340A may be between the compressed span 334A and a referencing element 342A (e.g., an internal node of the acceleration structure 212), a mapping 340B may be between the compressed span 334B and a referencing element 342B, a mapping 340C may be between a portion 336A of the compressed span 334C and a referencing element 342C, and a mapping 340D may be between a portion 336B of the compressed span 334C and a referencing element 342D.

As described herein, the element compressor 110 may be configured to apply a compression algorithm to the groups of elements to generate the compressed spans or groups of elements. Each worker thread (or group of worker threads) may use the same compression algorithm or a different compression algorithm. The memory allocator 108 may allocate one or more portions of the memory 130 to the spans or groups and/or worker threads based at least on an assumed compression ratio associated with the compression algorithm. By accounting for the assumed compression ratio when computing a memory size for one or more of the spans (e.g., a total memory size), memory ranges for different spans may be accounted for so that the memory ranges are sufficient to store all of the compressed data from the list of elements 120.

In embodiments, the compression algorithm may be a variable-rate compression algorithm, such that the same amount of data may be compressed to a different size depending on content of the data. In the example shown, for a worst-case compression ratio of the compression algorithm, each of the blocks 130A, 130B, 130C, 130D, 130E, 130F, and 130G of the memory 130 may store three elements of the elements 120 in compressed form. The examples shown also assume the worst-case compression ratio for each span, but in practice the compression ratios may vary per span where a block may store anywhere from three to ten elements (as a non-limiting example). Thus, the block 130A may store element 0, element 1, and element 2 for a worst-case compression ratio.

In various embodiments, the memory allocator 108 may compute a memory size to allocate to the spans using a worst-case compression ratio for the compression algorithm and/or a worst-case size for the compressed data. Thus, the size of a range of memory required for the spans may be computed in advance without the risk of under allocation for a compressed span and/or overlap between memory ranges for compressed spans. This may result in gaps between the compressed spans in the memory 130, as shown.

The example of FIG. 3 at 308 shows an approach to allocation where given spanElements is the number of elements of each span to compress prior to boundary adjustment, and BlocksElements is the worst-case number of elements that may be compressed into a block for a compression algorithm, SpanBlocks, representing the number of blocks allocated to the span may be computed as ⌈spanElements/BlocksElements⌉+1 padding block. For example, in FIG. 3, spanElements=8 and BlocksElements=3, such that 4 blocks may be allocated per span. It can be seen that prior to adjusting boundaries of the spans 330A, 330B, and 330C, and 330D, ⌈spanElements/BlocksElements⌉ represents the number of blocks needed to fit a worst-case size of the compressed data. The padding block accounts for a worst-case result of adjusting the boundaries in which one block is wasted per span.

The example of FIG. 3 at 310 shows an approach to computing output range locations where given SpanStartElementIdx is the index of the start point boundary of a span after adjustment (if any), and SpanIdx is an index number assigned to the span that is {0 . . . i–1}, where i is the total number of spans, the compressed data storage manager 112 (e.g., a worker thread or group of worker threads) may compute SpanFirstBlock representing a starting block of an output range for the span, using ⌊SpanStartElementIdx/BlockElements⌋+SpanIdx. For example,
for the span 330A, SpanStartElementIdx=0, SpanIdx=0, and BlockElements=3 so that SpanFirstBlock=⌊0/10⌋+0=0. For the span 330B, SpanStartElementIdx=11, SpanIdx=1, and BlockElements=3 so that SpanFirstBlock=⌊11/3⌋+1=4. For the span 330C, SpanStartElementIdx=21, SpanIdx=2, and BlockElements=3 so that SpanFirstBlock=⌊21/3⌋+2=9.

In various scenarios, the memory allocator 108 may not need to allocate the padding block while ensuring that enough memory is allocated for a worst-case compression ratio for each span. For example, if spanElements mod BlocksElements=1, the padding blocks may be avoided for the spans regardless of how many elements are assigned to a particular span. FIG. 4A is a diagram illustrating an example of a memory allocation scheme applied to spans for different adjustments to span ends made to a first span of the spans, in accordance with some embodiments of the present disclosure to embodiments of the present disclosure. FIG. 4A illustrates that for these scenarios when spanElements mod BlocksElements=1, the padding blocks may be removed even under worst-case conditions. In this example, spanElements=4 and BlocksElements=3. The number of blocks allocated to each span may then be ⌊4/3⌋=2. The depicted element indices correspond to a worst-case that assumes a block may fit at most 3 elements. The number next to a row represents an adjustment that may be made to an end point of a boundary for a first span of three initial spans. As indicated, in each case, each span is allocated enough blocks to fit the elements of the span in the worst-case scenario without overlapping other spans' allocations.

In the example of FIG. 4A, the compressed data storage manager 112 may compute output range locations using an approach where given SpanStartElementIdx is the index of the start point boundary of a span after adjustment, and InitialStartElementIdx is the index of the start point boundary of a span prior to the adjustment, $$SpanFirstBlock = SpanIdx * SpanBlocks + \left\lfloor \frac{SpanStartElementIdx - InitialStartElementIdx}{BlocksElements} \right\rfloor.$$

The example assumes a fixed-size is used to define the initial boundaries of the spans.

In the example of FIG. 4A, SpanBlocks=⌈4/3⌉=2, and with an adjustment of 1 element to the endpoint of the first span, $$SpanFirstBlock \text{ for the first span} = 0 * 2 + \left\lfloor \frac{0-0}{3} \right\rfloor = 0$$

and the first span grows to five elements (0 through 4). For the second span, $$SpanFirstBlock = 1 * 2 + \left\lfloor \frac{5-4}{3} \right\rfloor = 2$$

and the second span shrinks to three elements. For the third span, $$SpanFirstBlock = 2 * 2 + \left\lfloor \frac{8-8}{3} \right\rfloor = 4.$$

With an adjustment of 3 elements to the endpoint of the first span, $$SpanFirstBlock \text{ for the first span} = 0*2 + \left\lfloor \frac{0-0}{3} \right\rfloor = 0$$

as before and the first span grows to include block 2 (which originally belonged to the second span). For the second span, $$SpanFirstBlock = 1*2 + \left\lfloor \frac{7-4}{3} \right\rfloor = 3$$

as the start of the second span's output range moves out of the way. With an adjustment of 8 elements to the endpoint of the first span, the first span consumes all elements—this may happen if, for example, all triangles of the acceleration structure 212 are referenced from a single node.

FIG. 4B is a diagram illustrating an example of the memory allocation scheme of FIG. 4A applied to spans for different adjustments to span ends made to a first span and a second span of the spans, in accordance with some embodiments of the present disclosure to embodiments of the present disclosure. In the lower set of examples, the ends of the first and second spans are adjusted forward, and the allocations are likewise non-overlapping. FIG. 4B illustrates that for these scenarios when spanElements mod BlocksElements=1, the padding blocks may also be removed even under worst-case conditions. The examples of FIG. 4B may be similar to FIG. 4A, except that the number next to a row represents an adjustment that may be made to an end point of a boundary for a first span of three initial spans, and to an end point of a boundary for a second span of the three initial spans.

Embodiments may leverage this property even for spans that do not include a number of elements such that spanElements mod BlocksElements=1 by increasing (or decreasing) the size allocated to a span (e.g., each span) to a nearest value such that spanElements mod BlocksElements=1. For example, if spanElements=11 and BlocksElements=3, the memory allocator 108 may restrict spanElements to a value such that spanElements mod BlocksElements=1 by setting spanElements to 13. Similarly, if spanElements mod BlocksElements=0, the padding block may be avoided for the spans. Therefore, embodiments may additionally or alternatively leverage this property even for spans that initially do not include a number of elements such that spanElements mod BlocksElements=0 by increasing (or decreasing) the size of spanElements to a nearest value such that spanElements mod BlocksElements=0.

As described herein, the compaction manager 116 may be configured to compact one or more of the compressed spans or groups of elements in the memory to recover storage from one or more gaps which may form in the memory—such as gap 132 in the memory 130. At compaction time, a bitmask may be allocated that marks each output block, the number of set bits may be computed from the bitmask, and a prefix sum may be computed over the set bit counts. At compaction time, when copying a block to a new buffer, the compaction manager 116 (e.g., each worker thread or group of worker threads) may use the prefix sum and the bitmask values may be used to find a new position for a block. This may drop unused memory that is not needed to store the compressed elements. In some embodiments, compaction may be performed (e.g., after 312 in FIG. 3) based at least on an indicator and/or request from a user, such as in an API call used to build or refit the data structure. While compaction is described, this approach may be used for copy operations in general that involve one or more of the blocks.

Figure 5:
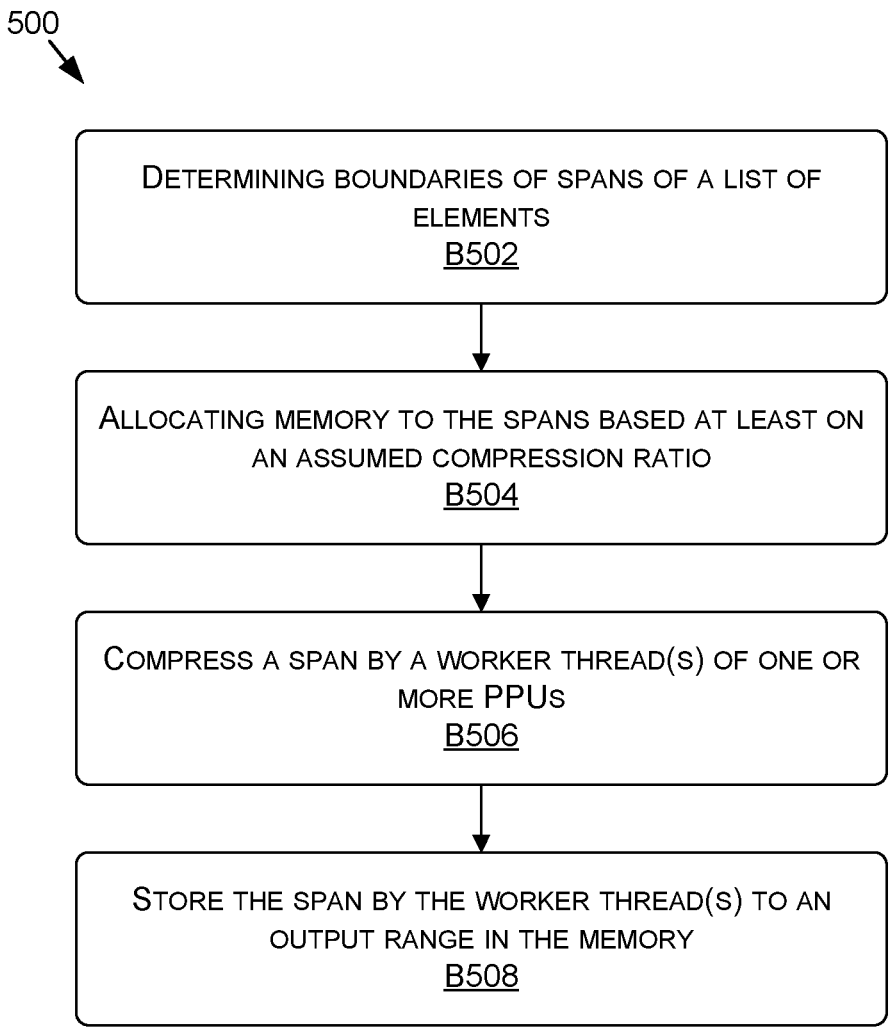
FIG. 5 is a flow diagram showing a method for using worker threads of one or more parallel processing units (PPUs) to compress a list of elements, in accordance with some embodiments of the present disclosure.

Now referring to FIG. 5, each block of method 500, and other methods described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, the method is described, by way of example, with respect to the system of FIG. 1. However, this method may additionally or alternatively be executed by any one system, or any combination of systems, including, but not limited to, those described herein.

FIG. 5 is a flow diagram showing a method 500 for using worker threads of one or more parallel processing units (PPUs) to compress a list of elements, in accordance with some embodiments of the present disclosure. The method 500, at block B502, includes determining boundaries of spans of a list of elements. For example, the boundary determiner 106 may determine boundaries of the spans 330A, 330B, and 330C, and 330D in a list of the elements 120, as shown in FIG. 3.

The method 500, at block B504, includes allocating memory to the spans based at least on an assumed compression ratio. For example, the memory allocator 108 may allocate a total range in the memory 130 sufficient to cover the memory ranges 332A, 332B, 332C, and 332D in the memory 130 for the spans 330A, 330B, and 330C, and 330D based at least on an assumed compression ratio associated with a variable-rate compression algorithm.

The method 500, at block B506, includes compressing a span by a worker thread(s) of one or more PPUs. For example, the element compressor 110 may compress, by each worker thread (or group of worker threads) of a plurality of worker threads of the one or more PPUs, a respective span of the spans using the variable-rate compression algorithm to generate a compressed version of the respective span. The compressed version of the spans may correspond to the compressed spans 334A, 334B, and 334C.

The method 500, at block B508, includes storing the span by the worker thread (or group of worker threads) to an output range in the memory. For example, the compressed data storage manager 112 may store, by each worker thread(s) of the plurality of worker threads, the compressed version of the respective span to an output range in one or more of the memory ranges memory ranges 332A, 332B, 332C, and 332D allocated to the spans.

Figure 6:
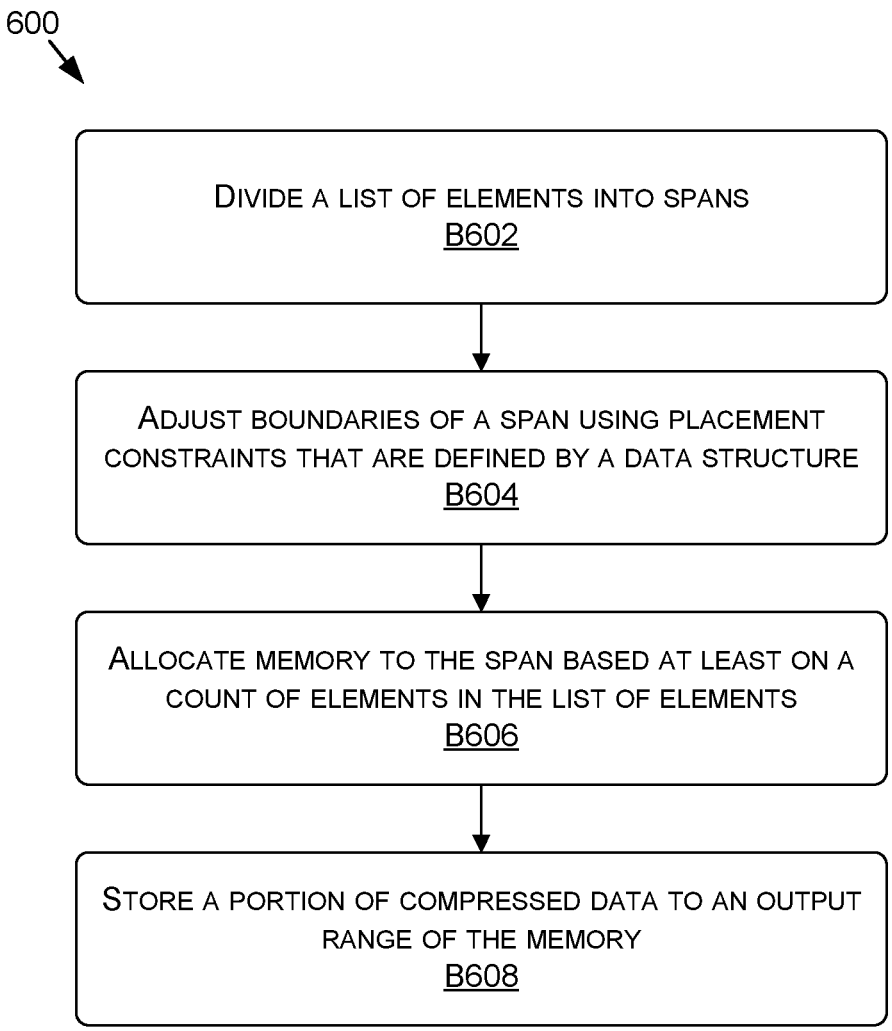
FIG. 6 is a flow diagram showing a method for compressing a list of elements based on placement constraints that are defined by a data structure, in accordance with some embodiments of the present disclosure.

FIG. 6 is a flow diagram showing a method 600 for compressing a list of elements based on placement constraints that are defined by a data structure, in accordance with some embodiments of the present disclosure. The method 600, at block B602, includes dividing a list of elements into spans. For example, the boundary determiner 106 may divide a list of the elements 120 into spans 330A, 330B, and 330C, and 330D of FIG. 3.

The method 600, at block B604, includes adjusting boundaries of a span using placement constraints that are defined by a data structure. For example, the boundary determiner 106 may adjust boundaries of one or more of the spans 330A, 330B, 330C, and 330D using placement constraints that are defined by the acceleration structure 212 of FIG. 2.

The method 600, at block B606, includes allocating memory to the span based at least on a count of elements in the list of elements. For example, the memory allocator 108 may allocate a portion of the memory 130 comprising the memory ranges 332A, 332B, 332C, and 332D for the spans 330A, 330B, and 330C, and 330D based at least on a count of elements in the list of elements 120.

The method 600, at block B608, includes storing a portion of compressed data to an output range of the memory. For example, the compressed data storage manager 112 may store, for each span of the spans 330A, 330B, and 330C, the compressed spans 334A, 334B, and 334C to at least one memory range of the memory ranges 332A, 332B, 332C, and 332D, where the compressed the spans 334A, 334B, and 334C are generated from applying a compression algorithm to the spans 330A, 330B, and 330C.

Figure 7:
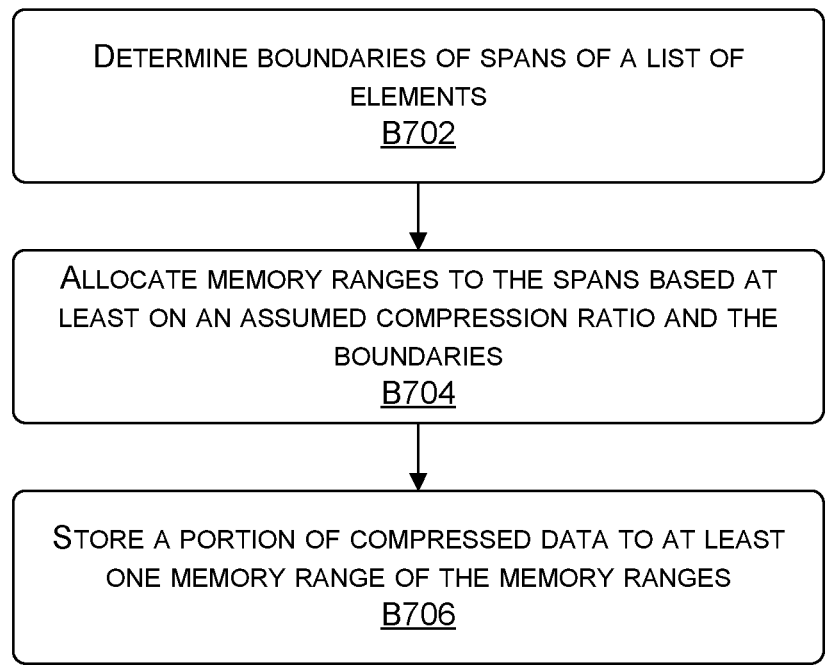
FIG. 7 is a flow diagram showing a method for compressing a list of elements based on an assumed compression ratio associated with a variable-rate compression algorithm, in accordance with some embodiments of the present disclosure.

FIG. 7 is a flow diagram showing a method 700 for compressing a list of elements based on an assumed compression ratio associated with a variable-rate compression algorithm, in accordance with some embodiments of the present disclosure. The method 700, at block B702, includes determining boundaries of spans of a list of elements. For example, the boundary determiner 106 may determine boundaries of the spans 330A, 330B, and 330C, and 330D of FIG. 3.

The method 700, at block B704, includes allocating memory ranges to the spans based at least on an assumed compression ratio and the boundaries. For example, the memory allocator 108 may allocate the memory ranges 332A, 332B, 332C, and 332D in the memory 130 to the spans 330A, 330B, and 330C, and 330D based at least on an assumed compression ratio associated with a compression algorithm and the boundaries.

The method 700, at block B706, includes storing a portion of compressed data to at least one memory range of the memory ranges. For example, the compressed data storage manager 112 may store, for each span of the spans 330A, 330B, and 330C, the compressed spans 334A, 334B, and 334C to at least one memory range of the memory ranges 332A, 332B, 332C, and 332D, where the compressed spans 334A, 334B, and 334C are generated from applying a compression algorithm to the spans 330A, 330B, and 330C.

FIG. 8 is a block diagram of an example computing device(s) 800 suitable for use in implementing some embodiments of the present disclosure. Computing device 800 may include an interconnect system 802 that directly or indirectly couples the following devices: memory 804, one or more central processing units (CPUs) 806, one or more graphics processing units (GPUs) 808, a communication interface 810, input/output (I/O) ports 812, input/output components 814, a power supply 816, one or more presentation components 818 (e.g., display(s)), and one or more logic units 820.

Although the various blocks of FIG. 8 are shown as connected via the interconnect system 802 with lines, this is not intended to be limiting and is for clarity only. For example, in some embodiments, a presentation component 818, such as a display device, may be considered an I/O component 814 (e.g., if the display is a touch screen). As another example, the CPUs 806 and/or GPUs 808 may include memory (e.g., the memory 804 may be representative of a storage device in addition to the memory of the GPUs 808, the CPUs 806, and/or other components). In other words, the computing device of FIG. 8 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 8.

The interconnect system 802 may represent one or more links or busses, such as an address bus, a data bus, a control bus, or a combination thereof. The interconnect system 802 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 806 may be directly connected to the memory 804. Further, the CPU 806 may be directly connected to the GPU 808. Where there is direct, or point-to-point connection between components, the interconnect system 802 may include a PCIe link to carry out the connection. In these examples, a PCI bus need not be included in the computing device 800.

The memory 804 may include any of a variety of computer-readable media. The computer-readable media may be any available media that may be accessed by the computing device 800. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 804 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 800. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 806 may be configured to execute at least some of the computer-readable instructions to control one or more components of the computing device 800 to perform one or more of the methods and/or processes described herein. The CPU(s) 806 may each include one or more cores (e.g., one, two, four, eight, twenty-eight, seventy-two, etc.) that are capable of handling a multitude of software threads simultaneously. The CPU(s) 806 may include any type of processor, and may include different types of processors depending on the type of computing device 800 implemented (e.g., processors with fewer cores for mobile devices and processors with more cores for servers). For example, depending on the type of computing device 800, the processor may be an Advanced RISC Machines (ARM) processor implemented using Reduced Instruction Set Computing (RISC) or an x86 processor implemented using Complex Instruction Set Computing (CISC). The computing device 800 may include one or more CPUs 806 in addition to one or more microprocessors or supplementary co-processors, such as math co-processors.

In addition to or alternatively from the CPU(s) 806, the GPU(s) 808 may be configured to execute at least some of the computer-readable instructions to control one or more components of the computing device 800 to perform one or more of the methods and/or processes described herein. One or more of the GPU(s) 808 may be an integrated GPU (e.g., with one or more of the CPU(s) 806 and/or one or more of the GPU(s) 808 may be a discrete GPU. In embodiments, one or more of the GPU(s) 808 may be a coprocessor of one or more of the CPU(s) 806. The GPU(s) 808 may be used by the computing device 800 to render graphics (e.g., 3D graphics) or perform general purpose computations. For example, the GPU(s) 808 may be used for General-Purpose computing on GPUs (GPGPU). The GPU(s) 808 may include hundreds or thousands of cores that are capable of handling hundreds or thousands of software threads simultaneously. The GPU(s) 808 may generate pixel data for output images in response to rendering commands (e.g., rendering commands from the CPU(s) 806 received via a host interface). The GPU(s) 808 may include graphics memory, such as display memory, for storing pixel data or any other suitable data, such as GPGPU data. The display memory may be included as part of the memory 804. The GPU(s) 808 may include two or more GPUs operating in parallel (e.g., via a link). The link may directly connect the GPUs (e.g., using NVLINK) or may connect the GPUs through a switch (e.g., using NVSwitch). When combined together, each GPU 808 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 806 and/or the GPU(s) 808, the logic unit(s) 820 may be configured to execute at least some of the computer-readable instructions to control one or more components of the computing device 800 to perform one or more of the methods and/or processes described herein. In embodiments, the CPU(s) 806, the GPU(s) 808, and/or the logic unit(s) 820 may discretely or jointly perform any combination of the methods, processes and/or portions thereof. One or more of the logic units 820 may be part of and/or integrated in one or more of the CPU(s) 806 and/or the GPU(s) 808 and/or one or more of the logic units 820 may be discrete components or otherwise external to the CPU(s) 806 and/or the GPU(s) 808. In embodiments, one or more of the logic units 820 may be a coprocessor of one or more of the CPU(s) 806 and/or one or more of the GPU(s) 808.

Examples of the logic unit(s) 820 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 810 may include one or more receivers, transmitters, and/or transceivers that enable the computing device 800 to communicate with other computing devices via an electronic communication network, included wired and/or wireless communications. The communication interface 810 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 812 may enable the computing device 800 to be logically coupled to other devices including the I/O components 814, the presentation component(s) 818, and/or other components, some of which may be built in to (e.g., integrated in) the computing device 800. Illustrative I/O components 814 include a microphone, mouse, keyboard, joystick, game pad, game controller, satellite dish, scanner, printer, wireless device, etc. The I/O components 814 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 800. The computing device 800 may be include depth cameras, such as stereoscopic camera systems, infrared camera systems, RGB camera systems, touchscreen technology, and combinations of these, for gesture detection and recognition. Additionally, the computing device 800 may include accelerometers or gyroscopes (e.g., as part of an inertia measurement unit (IMU)) that enable detection of motion. In some examples, the output of the accelerometers or gyroscopes may be used by the computing device 800 to render immersive augmented reality or virtual reality.

The power supply 816 may include a hard-wired power supply, a battery power supply, or a combination thereof. The power supply 816 may provide power to the computing device 800 to enable the components of the computing device 800 to operate.

The presentation component(s) 818 may include a display (e.g., a monitor, a touch screen, a television screen, a heads-up-display (HUD), other display types, or a combination thereof), speakers, and/or other presentation components. The presentation component(s) 818 may receive data from other components (e.g., the GPU(s) 808, the CPU(s) 806, etc.), and output the data (e.g., as an image, video, sound, etc.).

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A system comprising:
   one or more parallel processing units (PPUs) to perform a method comprising:
     dividing a plurality of elements of a data structure into two or more spans defined by one or more boundaries, the spans including a first span having at least a first element of the plurality of elements and a second span having at least a second element of the plurality of elements;
     determining an adjustment to the one or more boundaries of the spans based at least on a placement constraint corresponding to respective relative memory locations between compressed versions of the first element and the second element in a compressed version of the data structure;
     compressing, by one or more worker threads of the one or more PPUs, the first span and the second span using the one or more boundaries as defined by the adjustment to generate the compressed versions of the first span and the second span; and
     storing, by the one or more worker threads, the compressed versions of the first span and the second span in the respective relative memory locations in the compressed version of the data structure based at least on the adjustment.

2. The system of claim 1, wherein the plurality of elements comprises one or more of a list of triangles, a list of vertices, a list of bounding boxes of a three-dimensional mesh, or a list of geometry instances, and the data structure comprises a ray-tracing acceleration structure.

3. The system of claim 1, wherein the determining an adjustment comprises identifying a relationship between the first and second elements with respect to the data structure, the relationship being based at least on the first element and the second element having a same parent node in the data structure.

4. The system of claim 1, wherein the one or more boundaries are represented using a first index to an element in an array of the plurality of elements, the adjustment causes the first index to change to a second index of a different element in the array, and a worker thread of the one or more work threads uses the second index to identify the first span from the spans to compress and to compute one or more memory locations for the compressed version of the first span in the compressed version of the data structure.

5. The system of claim 1, wherein the adjustment causes a reassignment of at least the second element from the second span to the first span.

6. The system of claim 1, wherein the determining of the adjustment includes marking valid boundaries corresponding to the spans that satisfy the placement constraint based at least on identifying a relationship between the first and second elements with respect to the data structure, and the method further includes performing the adjustment of the one or more boundaries to match the valid boundaries based at least on the marking, wherein the one or more worker threads compute the respective relative memory locations and corresponding output ranges for the first span and the second span using the one or more boundaries in accordance with the adjustment.

7. The system of claim 6, further comprising generating markings representative of the valid boundaries in a bitmask based at least on the placement constraint and the identifying of the relationship, wherein the adjustment includes shifting the one or more boundaries using the markings in the bitmask.

8. The system of claim 1, wherein the compressing uses a variable-rate compression algorithm that causes a memory gap between the compressed versions of the first span and the second span in the compressed version of the data structure.

9. The system of claim 1, wherein the determining of the adjustment is based at least on restricting, to either 1 or 0, a value of a size of the first span modulus a largest compression size of the first span that is possible when using a variable-rate compression algorithm, wherein the variable-rate compression algorithm is used to generate the compressed versions of the first span and the second span.

10. A method comprising:
   determining one or more boundaries that define spans of a list of elements of a data structure using a placement constraint that is based at least on a relationship between a set of elements of the elements within the data structure, the placement constraint being on relative memory locations between respective compressed versions of the set of elements in a compressed version of the data structure;
   compressing, at least partially in parallel, the spans defined by the one or more boundaries to generate the compressed versions of the set of elements; and
   storing, at least partially in parallel, the compressed versions of the set of elements in the relative memory locations that are computed using the one or more boundaries and that satisfy the placement constraint in the compressed version of the data structure.

11. The method of claim 10, wherein the list of elements comprises one or more of a list of triangles, a list of vertices, a list of bounding boxes of a three-dimensional mesh, or a list of geometry instances, and the data structure comprises a ray-tracing acceleration structure.

12. The method of claim 10, wherein the relationship is based at least on the set of elements having a same parent node in the data structure.

13. The method of claim 10, wherein the placement constraint is for the set of elements to be placed in contiguous blocks in the compressed version of the data structure.

14. The method of claim 10, wherein the determining of the one or more boundaries includes marking valid boundaries of the spans that satisfy the placement constraint based at least on identifying the relationship, and the method further includes adjusting initial one or more boundaries of the spans to the one or more boundaries to match the valid boundaries based at least on the marking.

15. The method of claim 10, further comprising:
    marking a second data structure to indicate locations of blocks in memory that are allocated to store the list of elements;
    computing a prefix sum over a number of set bit counts for each word of words in the second data structure; and
    compacting the list of elements in the compressed version of the data structure, wherein a new memory location for a portion of compressed data of a span of the spans is based at least on the prefix sum and the second data structure.

16. A processor comprising:
    one or more circuits to determine one or more boundaries that define spans of a list of elements of a data structure using a placement constraint on relative memory locations of compressed versions of a set of elements in the list of elements in a compressed version of the list of elements, generate the compressed versions of the set of elements using the one or more boundaries, and store the compressed versions of the set of elements in the relative memory locations that satisfy the placement constraint in the compressed version of the list of elements based at least on the one or more boundaries.

17. The processor of claim 16, wherein the list of elements comprises one or more of a list of triangles, a list of vertices, a list of bounding boxes of a three-dimensional mesh, or a list of geometry instances, and the data structure comprises a ray-tracing acceleration structure.

18. The processor of claim 16, wherein the placement constraint is based at least on the set of elements having a same parent node in the data structure.

19. The processor of claim 16, wherein the placement constraint is defined by a data format of the compressed version of the list of elements and ensures compatibility with the data format.

20. The processor of claim 16, wherein the list of elements are compressed and stored in memory as the compressed version of the list of elements using a single processing pass performed by independent worker threads of one or more parallel processing units.

* * * * *